United States Patent
Ryan et al.

(10) Patent No.: US 7,670,915 B1
(45) Date of Patent: Mar. 2, 2010

(54) CONTACT LINER IN INTEGRATED CIRCUIT TECHNOLOGY

(75) Inventors: Errol Todd Ryan, Wappingers Fall, NY (US); Paul R. Besser, Sunnyvale, CA (US); Simon Siu-Sing Chan, Saratoga, CA (US); Robert J. Chiu, San Jose, CA (US); Mehrdad Mahanpour, Union City, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 41 days.

(21) Appl. No.: 10/791,096

(22) Filed: Mar. 1, 2004

(51) Int. Cl.
*H01L 21/20* (2006.01)
(52) U.S. Cl. .................. 438/301; 438/303; 438/305; 438/586; 438/626; 438/636; 257/E21.424; 257/E21.582; 257/E21.583; 257/E21.585; 257/E21.586
(58) Field of Classification Search .............. 438/197, 438/585, 597, 622, 630, 637, 625, 629, 655, 438/300–305, 586, 596, 626–636, 726, 737; 257/288, 506, 508, 382, E21.211, 424, 582–586
See application file for complete search history.

(56) References Cited

U.S. PATENT DOCUMENTS

| 6,858,506 B2 * | 2/2005 | Chang ..................... 438/301 |
| 2004/0142557 A1 * | 7/2004 | Levy et al. ................ 438/680 |
| 2005/0115929 A1 * | 6/2005 | Sakurai et al. ........... 219/69.13 |

OTHER PUBLICATIONS

S. Wolf, R.N. Tauber, Silicon Processing for the VLSI Era, vol. 1, 2nd edition, Lattice Press, 2000, p. 727.*

* cited by examiner

*Primary Examiner*—Michael S Lebentritt
(74) *Attorney, Agent, or Firm*—Farjami & Farjami LLP

(57) ABSTRACT

A method of forming an integrated circuit with a semiconductor substrate is provided. A gate dielectric is formed on the semiconductor substrate, and a gate is formed on the gate dielectric. Source/drain junctions are formed in the semiconductor substrate. A silicide is formed on the source/drain junctions and on the gate. An interlayer dielectric having contact holes therein is formed above the semiconductor substrate. Contact liners are formed in the contact holes, and contacts are then formed over the contact liners. The contact liners are nitrides of the contact material, and formed at a temperature below the thermal budget for the silicide.

20 Claims, 3 Drawing Sheets

CONTACT LINER IN INTEGRATED CIRCUIT TECHNOLOGY

BACKGROUND

1. Technical Field

The present invention relates generally to semiconductor technology, and more specifically to siliciding in semiconductor devices.

2. Background Art

Electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor (CMOS) transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions," which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions."

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the source/drain junctions. The openings are lined with a contact liner material and then are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the source/drain junctions and to the polysilicon gates. The contact openings are then lined with a contact liner, and filled with a conductive metal and interconnected by formation of conductive wires in other interlayer dielectric (ILD) layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and titanium silicide ($TiSi_2$), although recent attempts have been made to use nickel silicide (NiSi) as a transition material.

The silicides are formed by first applying a thin layer of the cobalt or titanium on the silicon substrate above the source/drain junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding." Since the shallow trench oxide and the sidewall spacers will not react to form a silicide, the silicides are aligned over the source/drain junctions and the polysilicon gates so the process is also referred to as "self-aligned siliciding," or "saliciding."

However, existing siliciding and saliciding have not succeeded in solving all the problems related to connecting metal contacts to silicon.

The problems include, but are not limited to, existing materials used for contact liners, such as titanium and titanium nitride, are difficult to use and exhibit poor coverage as dimensions of the contact opening get smaller.

Additionally, the existing contact liner materials are incompatible with some silicides, such as nickel silicides.

Furthermore, formation of the contact liner and the contact generally require two deposition tools adding to the cost of manufacturing transistors.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. Source/drain junctions are formed in the semiconductor substrate. A silicide is formed on the source/drain junctions and on the gate. An interlayer dielectric having contact holes therein is deposited above the semiconductor substrate. Contacts are then formed over the contact liners. The contact liners are nitrides of the contact material, and formed at a temperature below the thermal budget for the silicide.

This method significantly lowers the electrical resistance between the contacts and the silicon or polysilicon greatly improving performance of the integrated circuit.

The present invention overcomes the problems of existing materials used for contact liners, such as titanium and titanium nitride, as dimensions of contact openings get smaller.

The contact liner of the present invention is compatible with nickel silicides.

Additionally, formation of the contact liner and the contact in accordance with the present invention can be performed using one deposition tool thereby reducing the cost of manufacturing transistors.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
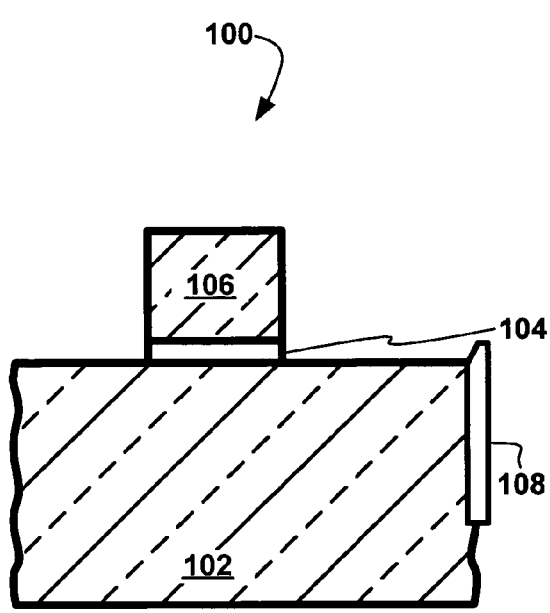
FIG. 1 is a view of a transistor in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a transistor 100 in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation (STI) 108.

Figure 2:
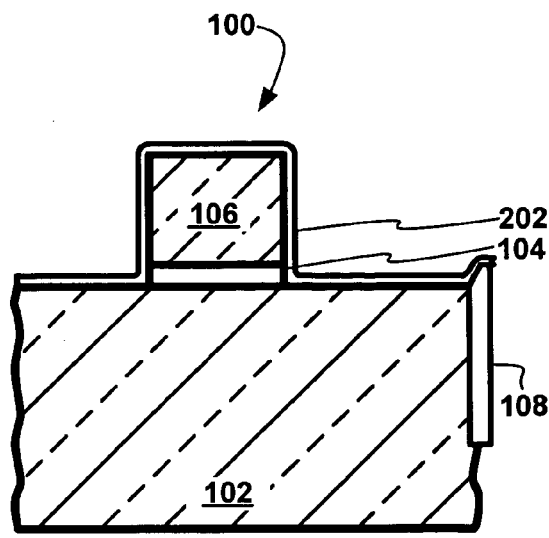
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
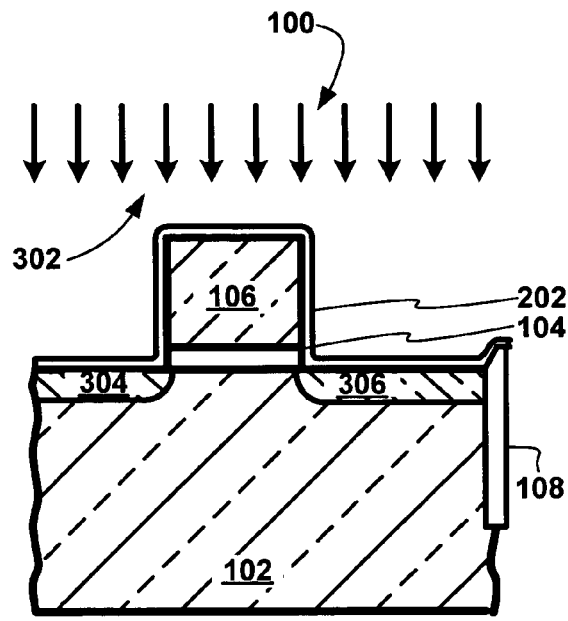
FIG. 3 is the structure of FIG. 2 during ion implantation to form shallow source/drain junctions.

Referring now to FIG. 3, therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow source/drain junctions 304 and 306.

Figure 4:
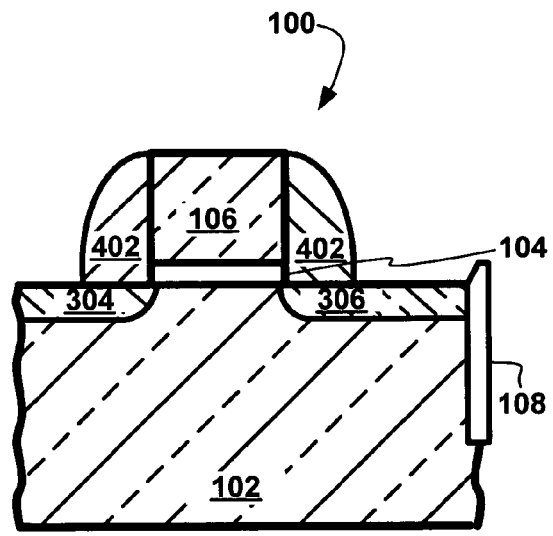
FIG. 4 is the structure of FIG. 3 after formation of a sidewall spacer.

Referring now to FIG. 4, therein is shown the structure of FIG. 3 after formation of a curved sidewall spacer 402.

The liner layer 202, which protects from implant damage, has been removed and a sidewall spacer layer, generally of silicon nitride, has been deposited and etched to form the curved shape of the sidewall spacer 402.

Figure 5:
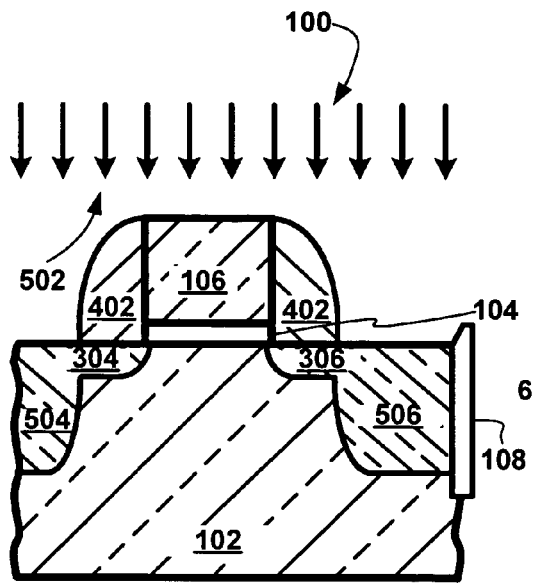
FIG. 5 is the structure of FIG. 4 during ion implantation to form deep source/drain junctions.

Referring now to FIG. 5, therein is shown the structure of FIG. 4 during an ion implantation 502 to form deep source/drain junctions 504 and 506.

The sidewall spacer 402, the gate 106, and the STI 108, act as masks for the formation of the deep source/drain junctions 504 and 506 by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the source/drain junctions 504 and 506.

Figure 6:
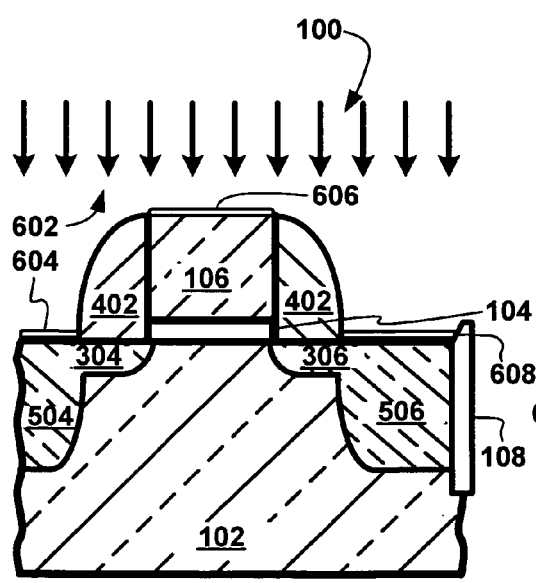
FIG. 6 is the structure of FIG. 5 during the formation of silicide.

Referring now to FIG. 6, therein is shown a deposition process 602 used in the formation of silicide layers 604, 606, and 608 in accordance with the present invention. The silicide layers 604 and 608 are formed with the surface of the semiconductor substrate 102 over the deep source/drain junctions 504 and 506, respectively, and the silicide 606 is formed on the gate 106.

The silicide 604, 606, 608 is formed of at least one of cobalt, titanium, nickel, arsenic doped nickel, an alloy thereof, a compound thereof, or a combination thereof, and preferably formed of nickel silicide (NiSi) since it has been found that nickel silicide has many desirable characteristics.

Generally, there are three ways in which to form a silicide. In one technique, the deposition process 602 deposits a pure metal on exposed silicon areas (both single crystalline and polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. In a second technique, the deposition process 602 involves co-evaporation of both metal and silicon onto the exposed silicon. Both metal and silicon are vaporized by, for example, an electron beam. The vapor is then drawn onto the wafer and across the silicon. In a third technique, the deposition process 602 involves co-sputtering both metal and silicon onto the silicon surface. Co-sputtering entails physically dislodging metal and silicon materials from a composite target or separate targets, and then directing the composite material onto the wafer.

Conventional salicidation processes have become problematic with modern semiconductor devices that have shallow source/drain junctions, e.g., junction depths on the order of 1000 Angstroms (Å). In particular, during such salicidation processes, some of the existing source/drain regions are consumed.

When cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

When the refractory metal is titanium, titanium silicide forms between metal contacts because the sidewall spacer becomes smaller with smaller integrated circuits thereby allowing a capacitive-coupled or fully conductive path between the polysilicon gate and the source/drain junctions, and similarly, degrades the performance of the integrated circuit.

While the present invention may be used with various refractory metal silicides, it has been found that nickel silicide has many desirable characteristics. However, in working with nickel silicide, it has been found to be difficult to form robust nickel. It has been thought that thick silicides around 100 Å thick with rough surfaces would best protect the silicon substrate and provide good adhesion.

However, an ultra-uniform nickel silicide can form extremely robust nickel silicide. By definition, an ultra-uniform silicide means a layer of silicide where there are no variations in thickness greater than about 3% of the overall thickness.

One example of forming ultra-uniform nickel ultra-uniform silicides 604, 606, and 608, is by depositing the nickel on the exposed silicon areas by a very low power vapor deposition process, where the very low power means a power level below 500 watts direct current and preferably between about 400 and 300 watts direct current.

In addition, an extra slow rate of metal deposition is preferred, which is defined to be below 7.0 Å per second and preferably between about 6.8 and 6.0 Å per second.

Still further, it is preferable that the silicide be deposited under these power levels and deposition rates to an ultra-thin thickness of not more than 50 Å thickness in order to provide an ultra-uniform, ultra-thin silicide. The deposited silicide metal is then converted to a silicide by an annealing process, such as an anneal up to about 700° C. depending upon the silicide metal being used.

Figure 7:
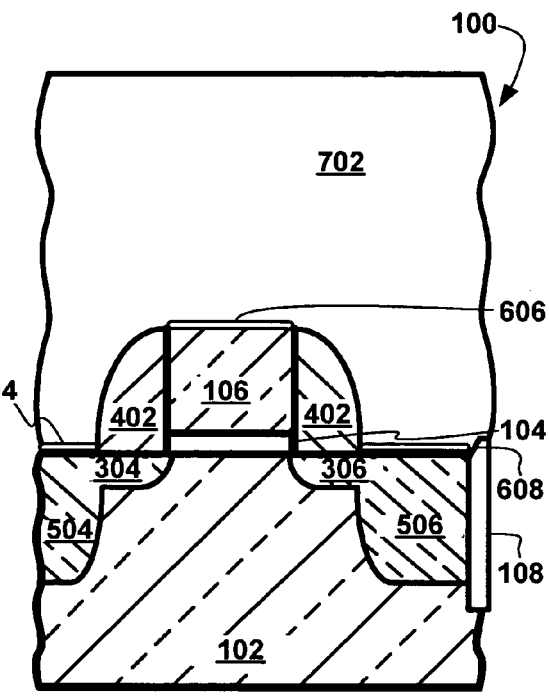
FIG. 7 is the structure of FIG. 6 after deposition of a dielectric layer over the silicide, the sidewall spacer, and shallow trench isolation.

Referring now to FIG. 7, therein is shown the structure of FIG. 6 after deposition of a dielectric layer 702 over the silicide layers 604, 606, and 608, the sidewall spacer 402, and the STI 108.

In various embodiments, the dielectric layer 107 are of dielectric materials such as silicon oxide ($SiO_x$), tetraethylorthosilicate (TEOS), borophosphosilicate (BPSG) glass, etc. with medium dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 8:
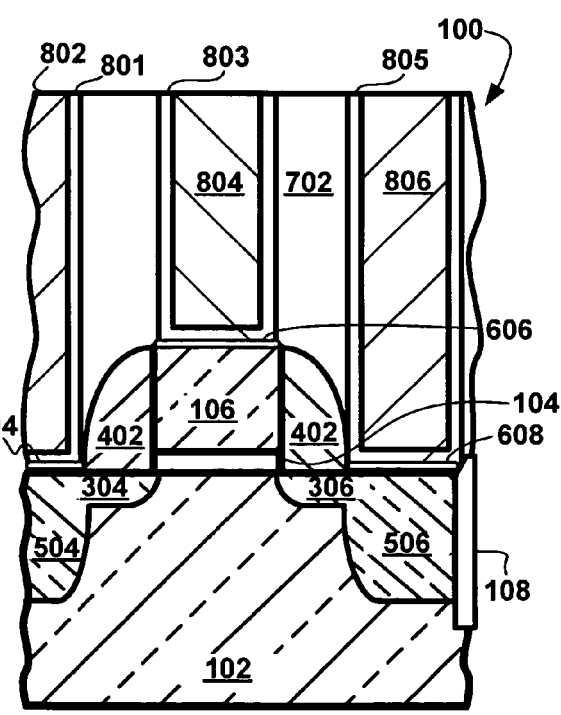
FIG. 8 is the structure of FIG. 7 after formation of contact liners and metal contacts.

Referring now to FIG. 8, therein is shown the structure of FIG. 7 after formation of contact liners 801, 803, and 805, and their associated metal contacts 802, 804, and 806.

The contact liners 801, 803, and 805 preferably are formed by atomic layer deposition (ALD) at a temperature of less than or equal to about 400° C., which is a temperature range compatible with the silicide layers 604, 606, and 608 comprising nickel silicide.

ALD is a deposition method in which deposition of each atomic layer of material is controlled by a pre-deposited layer of a precursor. Precursors of various components of the film are introduced alternately.

Generally, in atomic layer deposition, assuming that two precursor gases are used, a first precursor gas is introduced into a reaction chamber of an ALD device and atoms of the first precursor gas are chemisorbed on a surface in the chamber. Next, un-absorbed amounts of the first precursor gas is purged with an inert gas such as argon (Ar) or nitrogen ($N_2$) and a second precursor gas flows into the chamber. A chemical reaction between the first and second precursor gases occurs only on the portion of the surface on which the first precursor gas has been adsorbed, resulting in formation of an atomic layer on the surface. Un-reacted amounts of the second precursor gas and the by-products of the reaction between the two precursor gases are purged. The thickness of the film can be increased by repeating these steps to deposit successive atomic layers. In this manner, the thickness of the thin film can be adjusted in atomic layer units according to the number of repetitions. Atomic layer deposition processes according to the present invention typically are characterized by semiconductor substrate temperatures of between about 350 to about 700.degrees C. and reactor chamber pressures of about 1 to 120 Torr. A substantially flat temperature distribution can be maintained across the semiconductor substrate as the first precursor is chemisorbed and the second precursor is reacted with the chemisorbed precursor.

The ALD method, when used for depositing a thin film, can ensure near perfect step coverage regardless of the morphology of the surface. The composition of the atomic layer depends upon the nature of the reaction between the two precursor gases used.

Additionally, the contact liners 801, 803, and 805 preferably are formed of a nitride of the metal used for the metal contact, such as tungsten nitride (WN) when tungsten is used as the metal contact material. Preferably, the contact liners 801, 803, and 805 are selected so that the contact liners 801,803, and 805 can be deposited using the ALD process within the preferred temperature range of less than or equal to about the thermal budget for the particular silicide being used. In the case of nickel silicides, the thermal budget is about 400° C. to 450° C.

For example, it has been discovered that deposition of WN using the ALD process within a temperature range of about 400° C., or less results in the contact liners 801, 803, and 805 having step coverage that is substantially better than the coverage of titanium nitride using a plasma vapor deposition (PVD) or a (MOCVD) process. This is particularly the case as contact holes are manufactured smaller than about 100 microns, and NiSi is used as the silicide material.

Use of a nitride of the metal contact material for the contact liners 801, 803, and 805 also eliminates the need for two deposition tools. The same deposition tool can be used to deposit the contact liners 801, 803, and 805 as well as the metal contacts 802, 804, and 806 if the contact liners 801, 803, and 805 comprise a nitride of the metal contact material. For example, if the contact liners 801, 803, and 805 are formed of tungsten nitride and the metal contacts 802, 804, and 806 are formed of tungsten, the same deposition tool can be used to form both the contact liners 801, 803, and 805 and the metal contacts 802, 804, and 806.

The metal contacts 802, 804, and 806 are respectively electrically connected to the silicide layers 604, 606, and 608, and respectively to the deep source/drain junction 504, the gate 106, and the deep source/drain junction 506.

In various embodiments, the metal contacts 802, 804, and 806 are of metals such as tantalum (Ta), titanium (Ti), tungsten (W), alloys thereof, and compounds thereof. In other embodiments, the metal contacts 802, 804, and 806 are of metals such as copper (Cu), gold (Au), silver (Ag), alloys thereof, and compounds thereof with one or more of the above elements with diffusion barriers around them.

Figure 9:
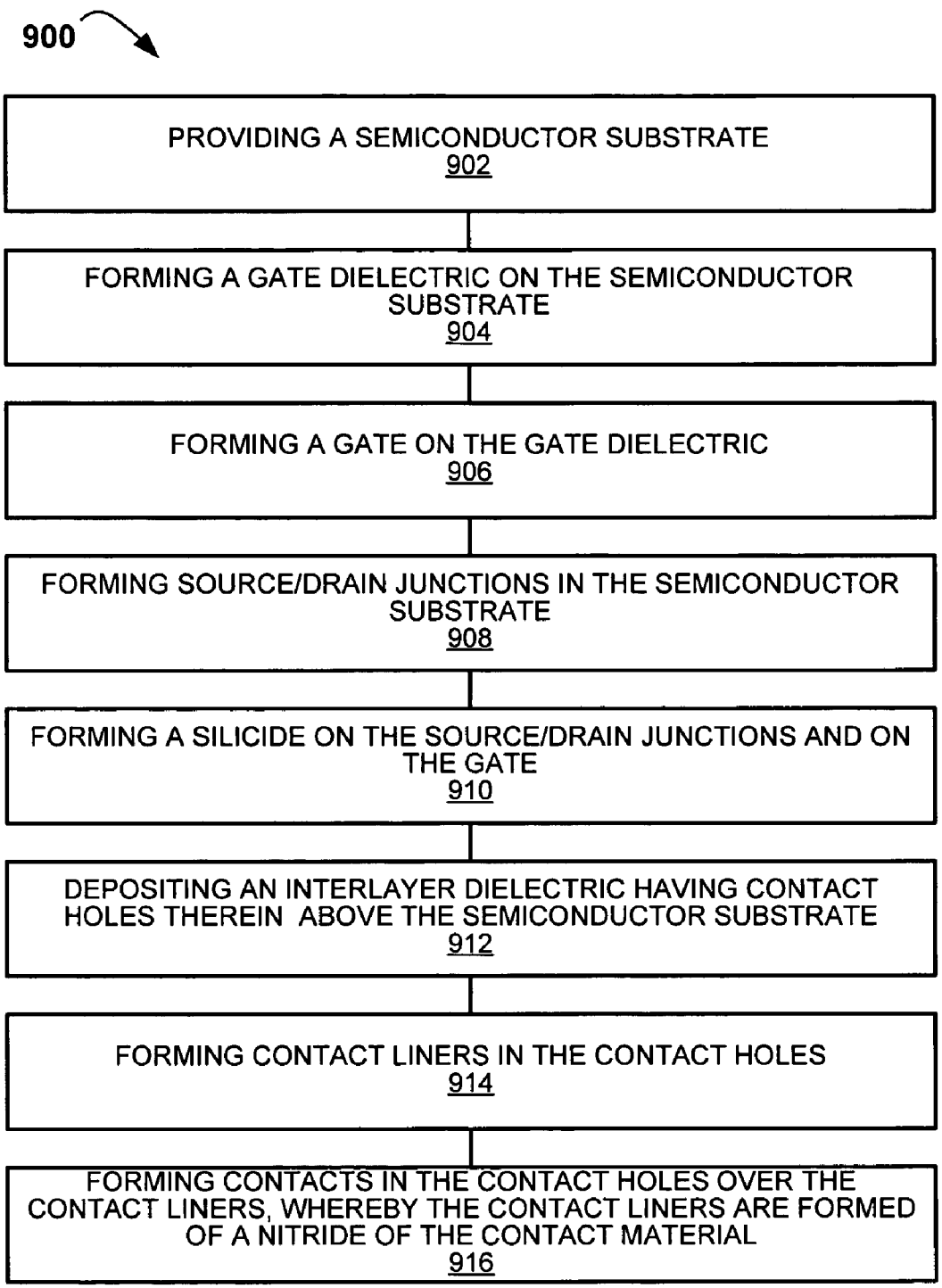
FIG. 9 is a simplified flow chart of the method of manufacturing the silicide in accordance with the present invention.

Referring now to FIG. 9, therein is shown a simplified flow chart of a method 900 in accordance with the present invention. The method 900 includes: providing a semiconductor substrate in a step 902; forming a gate dielectric on the semiconductor substrate in a step 904; forming a gate on the gate dielectric in a step 906; forming source/drain junctions in the semiconductor substrate in a step 908; forming a silicide on the source/drain junctions and on the gate in a step 910; depositing an interlayer dielectric having contact holes therein above the semiconductor substrate in a step 912; forming contact liners in the contact holes in a step 914; and forming contacts in the contact holes over the contact liners in a step, whereby the contact liners are formed of a nitride of the material of the contacts 916.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method of forming an integrated circuit comprising:
providing a semiconductor substrate;
forming a gate dielectric on the semiconductor substrate;
forming a gate on the gate dielectric;
forming source/drain junctions in the semiconductor substrate;
forming an ultra-uniform silicide having approximately less than 3% variation in thickness on the source/drain junctions and on the gate within a thermal budget having a temperature dependent upon a silicide metal;
depositing an interlayer dielectric having contact holes therein above the semiconductor substrate;
forming contact liners in the contact holes within the thermal budget for forming the ultra-uniform silicide; and
forming contacts in the contact holes over the contact liners, whereby the contact liners are formed of a nitride of the material of the contacts.

2. The method as claimed in claim 1 wherein:
forming the contact liners uses an atomic layer deposition process using a temperature not greater than approximately 400 degrees centigrade.

3. The method as claimed in claim 1 wherein:
forming the ultra-uniform silicide forms an ultra-uniform nickel silicide.

4. The method as claimed in claim 1 wherein:
forming the contacts forms a tungsten material; and
forming the contact liners forms a tungsten nitride material.

5. A method of forming an integrated circuit comprising:
providing a semiconductor substrate:
forming a gate dielectric on the semiconductor substrate;
forming a gate on the gate dielectric;
forming source/drain junctions in the semiconductor substrate;
forming ultra-uniform nickel silicide having approximately less than 3% variation in thickness on the source/drain junctions and on the gate within a thermal budget having a temperature of less than about 400 degrees centigrade, the ultra-uniform nickel silicide being formed by using a very low power vapor deposition process;
depositing an interlayer dielectric having contact holes therein above the semiconductor substrate;
forming tungsten nitride contact liners in the contact holes within the thermal budget for forming the ultra-uniform nickel silicide; and
forming tungsten contacts in the contact holes over the contact liners.

6. The method as claimed in claim 5 wherein:
forming the tungsten nitride contact liners uses an atomic layer deposition process using a temperature not greater than approximately 400 degrees centigrade.

7. The method as claimed in claim 5 wherein:
forming the ultra-uniform nickel silicide uses a nickel silicide metal having a thickness of not more than 50 Angstroms.

8. The method as claimed in claim 5 wherein:
depositing the interlayer dielectric deposits a dielectric material having a dielectric constant selected from a group consisting of medium, low, and ultra-low dielectric constants.

9. An integrated circuit comprising:
a semiconductor substrate;
a gate dielectric on the semiconductor substrate;
a gate on the gate dielectric;
source/drain junctions in the semiconductor substrate;
an ultra-uniform silicide having approximately less than 3% variation in thickness on the source/drain junctions and on the gate;
an interlayer dielectric having contact holes therein above the semiconductor substrate;
contact liners in the contact holes; and
contacts in the contact holes over the contact liners, whereby the contact liners are formed of a nitride of the material of the contacts.

10. The integrated circuit as claimed in claim 9 wherein:
the ultra-uniform silicide is an ultra-uniform nickel silicide.

11. The integrated circuit as claimed in claim 9 wherein:
the interlayer dielectric is a dielectric material having a dielectric constant selected from a group consisting of medium, low, and ultra-low dielectric constants.

12. The integrated circuit as claimed in claim 9 wherein:
the contacts in the contact holes are materials selected from a group consisting of tantalum, titanium, tungsten, copper, gold, silver, an alloy thereof, a compound thereof, and a combination thereof.

13. The integrated circuit as claimed in claim 9 wherein:
the contacts are a tungsten material; and
the contact liners are a tungsten nitride material.

14. An integrated circuit comprising:
a semiconductor substrate;
a gate dielectric on the semiconductor substrate;
a gale on the gate dielectric;
source/drain junctions in the semiconductor substrate;
an ultra-uniform nickel silicide having approximately less than 3% variation in thickness on the source/drain junctions and on the gate,
an interlayer dielectric having contact holes therein above the semiconductor substrate;
tungsten nitride contact liners in the contact holes; and
tungsten contacts in the contact holes over the contact liners.

15. The integrated circuit as claimed in claim 14 wherein:
the interlayer dielectric is a dielectric material having a dielectric constant selected from a group consisting of medium, low, and ultra-low dielectric constants.

16. The integrated circuit as claimed in claim 14 wherein:
the nickel silicide further comprises arsenic doping.

17. The method as claimed in claim 1 wherein:
forming the ultra-uniform silicide includes depositing the silicide metal using a vapor deposition process with a power level below 500 watts direct current.

18. The method as claimed in claim 1 wherein:
forming the ultra-uniform silicide includes depositing the silicide metal at a deposition rate below approximately 7.0 Angstroms per second.

19. The method as claimed in claim 1 wherein:
forming the ultra-uniform silicide uses a nickel silicide metal having a thickness of not more than 50 Angstroms.

20. The method as claimed in claim 5 wherein:
forming the ultra-uniform nickel silicide includes depositing a nickel silicide metal at a deposition rate below approximately 7.0 Angstroms per second.

* * * * *